(12) United States Patent
Iwamoto et al.

(10) Patent No.: US 7,838,107 B2
(45) Date of Patent: Nov. 23, 2010

(54) ALUMINUM-SILICON CARBIDE COMPOSITE

(75) Inventors: Goh Iwamoto, Omuta (JP); Hideki Hirotsuru, Omuta (JP); Kazunori Hirahara, Omuta (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/575,262

(22) PCT Filed: Sep. 7, 2005

(86) PCT No.: PCT/JP2005/016453

§ 371 (c)(1),
(2), (4) Date: Mar. 14, 2007

(87) PCT Pub. No.: WO2006/030676

PCT Pub. Date: Mar. 23, 2006

(65) Prior Publication Data

US 2007/0248829 A1    Oct. 25, 2007

(30) Foreign Application Priority Data

Sep. 14, 2004 (JP) ............................. 2004-266144

(51) Int. Cl.
- *B32B 5/14* (2006.01)
- *B32B 5/22* (2006.01)
- *B32B 3/26* (2006.01)
- *G11B 11/105* (2006.01)
- *B22F 3/00* (2006.01)
- *B32B 9/00* (2006.01)

(52) U.S. Cl. ............. 428/307.7; 428/313.3; 428/313.9; 428/317.9; 428/318.4; 428/319.1; 428/332; 428/545; 428/698

(58) Field of Classification Search .............. 428/307.7, 428/313.3, 313.9, 315.9, 317.9, 318.4, 319.1, 428/545, 332

See application file for complete search history.

(56) References Cited

U.S. PATENT DOCUMENTS 6,399,187 B1 *   6/2002   Terasaki et al. .......... 428/307.7

(Continued)

FOREIGN PATENT DOCUMENTS

JP              5 507030          10/1993

(Continued)

OTHER PUBLICATIONS

U.S. Appl. No. 12/299,143, filed Oct. 31, 2008, Iwamoto, et al.

(Continued)

*Primary Examiner*—Timothy M Speer
*Assistant Examiner*—Jonathan C Langman
(74) *Attorney, Agent, or Firm*—Oblon, Spivak, McClelland, Maier & Neustadt, L.L.P.

(57) ABSTRACT

An aluminum/silicon carbide composite prepared by infiltrating a flat silicon carbide porous body with a metal containing aluminum as the main component, including an aluminum alloy layer made of a metal containing aluminum as the main component on both principal planes, and one principal plane is bonded to a circuit plate and the other principal plane is utilized as a radiation plane. The silicon carbide porous body is formed or machined into a convexly bowed shape, and after infiltration with the metal containing aluminum as the main component, the aluminum alloy layer on the radiation plane is further machined to form the bow shape. The aluminum/silicon carbide composite is suitable as a base plate for a ceramic circuit plate on which semiconductor components are mounted, for which high reliability is required.

11 Claims, 1 Drawing Sheet

U.S. PATENT DOCUMENTS 6,447,894 B1 * 9/2002 Hirotsuru et al. ......... 428/307.7
2004/0246682 A1 * 12/2004 Osakada et al. ............ 361/709

FOREIGN PATENT DOCUMENTS

| JP | 2000 281468 | 10/2000 |
| JP | 2001-291809 | 10/2001 |
| JP | 2004-047619 | 2/2004 |
| JP | 2004-055577 | 2/2004 |

OTHER PUBLICATIONS

Japanese Office Action mailed Oct. 5, 2010 in Japanese Patent Application No. 2006-535802 (with English translation) 7 pages.

* cited by examiner

ALUMINUM-SILICON CARBIDE COMPOSITE

TECHNICAL FIELD

The present invention relates to an aluminum/silicon carbide composite suitable as a base plate for a circuit plate. In the present invention, the major axis represents a diagonal in a case where the shape of a flat plate is a tetragon, a diameter in a case of a circle, a major axis in the case of an ellipse and the longest axis in the case of other shapes.

BACKGROUND ART

At present, along with high integration and miniaturization of semiconductor devices, the heat generation amount is increasingly high, and the problem is how effectively heat is dissipated. And, a substrate which comprises a ceramic circuit plate comprising a ceramic substrate having high insulating properties and high thermal conductivity, such as an aluminum nitride substrate or a silicon nitride substrate, and a metal circuit made of copper or aluminum formed on the surface of the ceramic substrate, and which has a base plate made of copper or aluminum, as a heat dissipation plate, formed on the back side of the ceramic circuit plate, has been used e.g. as a substrate for a power module.

As a typical heat dissipation structure of a conventional ceramic circuit plate, a base plate is soldered to the ceramic circuit plate, and the base plate is commonly made of copper or aluminum. However, in such a structure, if a heat load is applied for example, cracking resulting from the difference in the coefficient of thermal expansion between the base plate and the ceramic circuit plate results in the solder layer and as a result, heat dissipation tends to be insufficient, thus leading to malfunction or fracture of the semiconductor on the circuit.

Accordingly, as a base plate having a coefficient of thermal expansion close to that of a ceramic circuit plate, an aluminum alloy-silicon carbide composite has is been proposed in JP-A-5-507030.

A base plate is bonded to a head dissipation fin, a heat dissipation unit or the like in many cases, and the shape and the bow at the joint portion are also important. For example, in a case where a base plate is bonded to a heat dissipation fin, a heat dissipation unit or the like, usually they are fixed by screws utilizing holes provided at the peripheral portion of the base plate. If there are very fine irregularities on the base plate, a gap will form between the base plate and the heat dissipation fin, the heat dissipation unit or the like, and thermal conductivity decreases in some cases even if a highly thermal conductive heat dissipating grease is applied. As a result, the heat dissipation properties of the entire module comprising the ceramic circuit plate, the base plate, and the heat dissipation fin, the heat dissipation unit or the like tend to decrease.

Accordingly, convex bow is preliminarily imparted to the base plate in many cases to prevent a gap from being formed between the base plate and the heat dissipation fin as far as possible. The bow is obtained usually by applying a pressure to the base plate with heating by using a jig having a predetermined shape. However, with respect to the bow obtained by such a method, the dispersion of the amount of bow tends to be large, and the shape of the bow is not constant, and accordingly, the quality is not stable. Further, by the dispersion of the shape of the bow, a gap may form between the base plate and the heat dissipation fin, the heat dissipation unit or the like.

There is also a method wherein the surface of the base plate is cut by machining to impart bow. However, in the case of an aluminum/silicon carbide composite, the material is very hard, and accordingly, grinding employing a tool of e.g. diamond is required, whereby the processing time tends to be long, and the cost tends to be expensive.

Accordingly, in order to solve the above problems, a method has been proposed wherein a flat silicon carbide porous body is infiltrated with a metal containing aluminum as the main component, an aluminum alloy layer is formed on both principal planes, and the aluminum alloy layer on the radiation plane side is machined. In the present invention, an aluminum alloy layer means a metal layer containing aluminum as the main component, such as an aluminum alloy layer.

However, of the base plate produced by the above method, the center portion of the aluminum alloy layer tends to be thick after machining. Accordingly, when the base plate is soldered to the ceramic circuit plate to assemble a power module, the shape at the center portion of the radiation plane may be distorted depending upon the disposition of the ceramic circuit plate, a gap is formed between the base plate and the heat dissipation fin, and no sufficient heat dissipation properties can be exhibited in some cases.

Further, in the above method, in order to control the thickness of the aluminum alloy layer on both principal planes, a high purity aluminum plate having a melting point higher than that of an aluminum alloy to be used for infiltration, is used in some cases, and local difference in the color tone may result due to the reaction between the high purity aluminum and the aluminum alloy layer having a low melting point at the time of infiltration in some cases.

DISCLOSURE OF THE INVENTION

Object to be Accomplished by the Invention

Under these circumstances, it is an object of the present invention to provide an aluminum/silicon carbide composite suitable as a base plate for a power module.

Means to Accomplish the Object

The present inventors have conducted extensive studies to accomplish the above object and as a result, achieved the following aluminum/silicon carbide composite.

(1) An aluminum/silicon carbide composite which is prepared by infiltrating a flat silicon carbide porous body with a metal containing aluminum as the main component, which has an aluminum alloy layer made of a metal containing aluminum as the main component on both principal planes, and of which one principal plane is bonded to a circuit plate and the other principal plane is utilized as a radiation plane, characterized in that the radiation plane of the silicon carbide porous body is formed or machined into a convexly bowed shape, and after infiltration with the metal containing aluminum as the main component, the aluminum alloy layer on the radiation plane is further machined to form bow.

(2) The aluminum/silicon carbide composite according to the above (1), wherein the average thickness of the aluminum alloy layer on the plane bonded to a circuit plate is from 0.1 to 0.3 mm, the difference of the thickness of the aluminum alloy layer in the plane bonded to a circuit plate is within 0.1 mm, and the difference in the average thickness between the aluminum alloy layers on both principal planes is within 40% of the average thickness of the thicker aluminum alloy layer.

(3) The aluminum/silicon carbide composite according to the above (1) or (2), wherein the aluminum alloy layer made of a metal containing aluminum as the main component contains from 5 to 40 mass % of at least one member among fibers, spherical particles and crushed particles, containing alumina or silica as the main component.

(4) The aluminum/silicon carbide composite according to any one of the above (1) to (3), which has a coefficient of thermal conductivity of at least 180 W/mK and a coefficient of thermal expansion of at most $10 \times 10^{-6}$/K.

(5) The aluminum/silicon carbide composite according to any one of the above (1) to (4), wherein the change in the amount of bow is at most 30 μm per 200 mm in the major axis direction on the radiation plane, as between before and after heat treatment to remove distortion by processing.

(6) The aluminum/silicon carbide composite according to any one of the above (1) to (5), which is produced by high pressure casting.

EFFECTS OF THE INVENTION

The aluminum/silicon carbide composite of the present invention has properties such as low thermal expansion and high thermal conductivity. By preliminarily forming or machining one principal plane of a flat silicon carbide porous body into a convex shape before infiltration with an aluminum alloy and further machining the surface aluminum alloy layer after infiltration with an aluminum alloy, heat dissipation properties after soldering to a ceramic circuit plate tend to be good as compared with a conventional method of imparting bow. The composite can be easily processed into a predetermined shape, the shape of the radiation plane is less likely to be distorted, and occurrence of local irregular color in the outer appearance can be prevented, and accordingly the composite is suitable as a base plate for a ceramic circuit plate on which semiconductor components are to be mounted, for which high reliability is particularly required.

MEANINGS OF SYMBOLS

Figure 1:
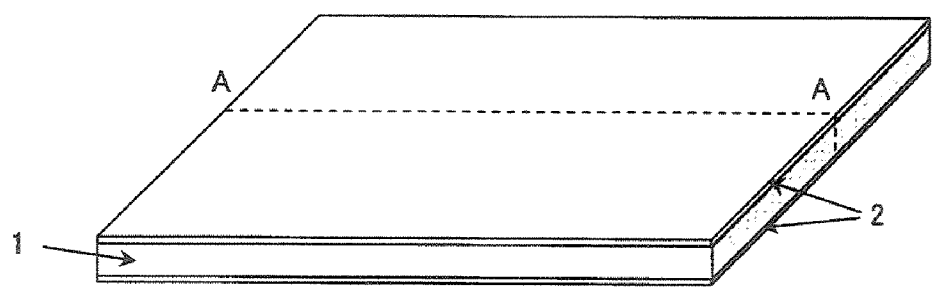
FIG. 1 is a perspective view illustrating the embodiment of the aluminum/silicon carbide composite of the present invention.
Figure 2:
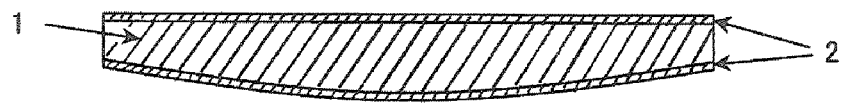
FIG. 2 is a cross-section at A-A in FIG. 1.

1: aluminum/silicon carbide composite
2: aluminum alloy layer

BEST MODE FOR CARRYING OUT THE INVENTION

The process for producing a metal/ceramic composite is roughly classified into two types of infiltration and powder metallurgy. Among them, products with sufficient properties such as a coefficient of thermal conductivity cannot be obtained by the powder metallurgy, and practically commercialized are products obtained by infiltration. The infiltration includes various production processes, and a process carried out under normal pressure and a process carried out under high pressure (high pressure casting) are mentioned. The high pressure casting includes squeeze casting and die casting.

A process suitable in the present invention is high pressure casting comprising infiltration under high pressure and either of the squeeze casting and the die casting can be employed, but the squeeze casting is more preferred. The high pressure casting is a method of putting a ceramic porous body (hereinafter referred to as a preform) into a high pressure container and infiltrating it with a molten metal of an aluminum alloy under high pressure to obtain a composite.

Now, the present invention will be described with reference to a preparation example by squeeze casting.

The process for producing a silicon carbide porous body (hereinafter referred to as SiC preform) of the present invention is not particularly limited, and production by a known method is possible. For example, the preform can be obtained by mixing silica, alumina or the like as a binder with a silicon carbide (hereinafter referred to as SiC) power as a material, followed by mixing, forming and firing at 800° C. or above. The forming method is also not particularly limited, and press-molding, extrusion, casting or the like may be employed, and it is possible to use a forming binder in combination as the case requires.

The convex bow on one principal plane of the SiC preform, which is one of the characteristics of the present invention, is formed by forming or machining. The forming or machining method is not particularly limited, and either of a method of using a mold having a shape imparted, when the mixture having the binder added to the SiC powder is formed in the above process for producing a SiC preform, and a method of machining one principal plane after firing to form a convex shape, can be employed.

As a method of infiltrating the SiC preform with an aluminum alloy to obtain an aluminum/silicon carbide composite, the following method may, for example, be mentioned. A SiC preform is accommodated in a frame, and at least one member among fibers, spherical particles and crushed particles, containing alumina or silica as the main component, is disposed to be in direct contact with both principal planes of the frame, to obtain one block. As an aluminum alloy, preferably, AC4C, AC4CH, ADC12 or the like is used. The above block is preheated at a temperature of from about 500 to about 650° C., and one or more such blocks are disposed in a high pressure container, and a molten metal of an aluminum alloy is pressurized under a pressure of at least 30 MPa as quickly as possible so as to prevent the temperature decrease of the block, so that the aluminum alloy is infiltrated into pores in the SiC preform, whereby an aluminum/silicon carbide composite having an aluminum alloy layer formed on both principal planes is obtained. In the present invention, annealing is carried out in some cases for the purpose of removing distortion caused at the time of infiltration.

The important characteristics of the aluminum/silicon carbide composite of the present invention, prepared by infiltrating a SiC preform with aluminum or its alloy, are a coefficient of thermal conductivity and a coefficient of thermal expansion. A higher SiC content in the SiC preform is preferred since a higher coefficient of thermal conductivity and a lower coefficient of thermal expansion are obtained, but if the content is high, the preform is not sufficiently infiltrated with the aluminum alloy in some cases. Practically, preferred is a SiC preform containing at least 40 mass % of coarse SiC particles having an average particle size of preferably at least 40 μm and having a relative density preferably within a range of from 55 to 75%. The strength of the SiC preform is preferably at least 3 MPa by bending strength, so as to prevent fracture at the time of handling or during infiltration.

The material SiC powder for the SiC preform is preferably subjected to particle size adjustment. The strength will not sufficiently be developed only with coarse particles, and on the other hand, a high coefficient of thermal conductivity of the composite to be obtained cannot be desired in some cases only with fine particles. According to studies by the present inventors, for example, a mixed powder comprising from 40 to 80 mass % of SiC coarse particles having an average particle size of preferably from 40 to 150 μm and from 60 to 20 mass % of SiC fine particles having an average particle size of preferably from 5 to 15 μm, is suitable.

The SiC preform is obtained by rebindering and firing a formed product of the mixture obtained by adding the binder to the above SiC powder. When the firing temperature is 800° C. or above, a SiC preform having a bending strength of at least 3 MPa can be obtained regardless of the atmosphere at the time of firing. However, in an oxidizing atmosphere, if firing is carried out at a temperature exceeding 1,100° C., oxidation of SiC is accelerated, thereby to reduce the coefficient of thermal conductivity of an aluminum/silicon carbide composite in some cases. Thus, in an oxidizing atmosphere, firing is carried out preferably at a temperature of at most 1,100° C. The firing time can be suitably determined depending upon conditions such as the size of the SiC preform, the amount of the preform charged to a firing furnace and the firing atmosphere.

When the SiC preform of the present invention is formed to have a predetermined shape, the change of the bow by drying can be prevented either by drying preforms one by one or by drying preforms using a spacer made of e.g. carbon having the same shape as the preform shape. Further, with respect to firing also, by the same treatment as in drying, it is possible to prevent the change of the shape accompanying the change of the internal structure.

Further, the aluminum alloy in the aluminum/silicon carbide composite of the present invention has a melting point as low as possible, so that it will be sufficiently infiltrated into pores of the preform at the time of infiltration. Such an aluminum alloy may, for example, be an aluminum alloy containing from 7 to 25 mass % of silicon. It is preferred to further incorporate magnesium, whereby bonding between silicon carbide particles and a metal portion will be firmer. Metal components in the aluminum alloy other than the aluminum, silicon and magnesium are not particularly limited so long as the characteristics will not extremely be changed, and for example, copper may be contained.

In the present invention, in order to form an aluminum alloy layer having a predetermined thickness, it is preferred that at least one member among fibers, spherical particles and crushed particles, containing alumina or silica as the main component, is disposed to be in direct contact with the surface of the SiC preform in a stacking step, whereby not only an aluminum alloy layer having a predetermined thickness can be formed but also such advantages can be obtained that there is substantially no irregular color after infiltration and that processability will improve when a shape is imparted.

The content of a material comprising at least one member among fibers, spherical particles and crushed particles, containing alumina or silica as the main component, in the aluminum alloy layer, is preferably from 5 to 40 mass %, particularly preferably from 10 to 20 mass %, based on the mass of the aluminum/silicon carbide composite. If the content is less than 5 mass %, it is difficult to control the thickness of the aluminum alloy layer on both principal planes in some cases, and the shape of the bow is significantly changed by annealing after processing in some cases. On the other hand, if the content exceeds 40 mass %, the aluminum alloy layer tends to be too hard, and usual machining tends to be difficult.

Annealing carried out for the purpose of removing distortion at the time of the infiltration of the SiC preform with the aluminum alloy is carried out preferably at a temperature of from 400 to 550° C. for at least 10 minutes. If the annealing temperature is less than 400° C., the distortion in the interior of the composite is not sufficiently released, and the bow is significantly changed in the annealing step after machining in some cases. On the other hand, if the annealing temperature exceeds 550° C., the aluminum alloy used for the infiltration is melted in some cases. If the annealing time is less than 10 minutes, the distortion in the interior of the composite is not sufficiently released even when the annealing temperature is from 400 to 550° C., and the bow is significantly changed in some cases in the annealing step to remove distortion by processing after machining.

With respect to the thickness of the aluminum alloy layer formed on the surface of the aluminum/silicon carbide composite, the thicknesses on both principal planes may be the same in the case where both principal planes are machined, but in a case where only the aluminum alloy layer on the radiation plane side is processed, it is preferred that the aluminum alloy layer on the radiation plane side to be processed is preliminarily made thick so that the thicknesses of the aluminum alloy layers on both principal planes are greatly different after processing. The average thickness of the aluminum alloy layer on the plane bonded to a circuit plate is preferably from 0.1 to 0.3 mm, and the difference in the average thickness between the aluminum alloy layers on both principal planes is preferably within 40% of the average thickness of the thicker aluminum alloy layer.

If the average thickness of the aluminum alloy layer on the plane bonded to a circuit plate is less than 0.1 mm, a machining chip may be touched to the SiC preform structure portion in the aluminum/silicon carbide composite at the time of machining, thus causing chipping and further, the SiC preform structure portion in the aluminum/silicon carbide composite may be exposed, thus causing plating failure in some cases. On the other hand, if the average thickness of the aluminum alloy layer on the plane bonded to a circuit plate exceeds 0.3 mm, the shape on the radiation plane may be distorted after the composite is soldered to a ceramic circuit plate, whereby a gap is formed between the composite with a heat dissipation fin, and no sufficient heat dissipation properties are obtained in some cases. Further, if the thickness in the average thickness between the aluminum alloy layers on both principal planes exceeds 40% of the average thickness of the thicker aluminum alloy layer, the coefficient of thermal conductivity is decreased, or the amount of bow is changed by the difference in the coefficient of thermal expansion between the aluminum alloy layers on both principal planes at the time of subsequent annealing to remove distortion by processing, in some cases.

The difference of the thickness of the aluminum alloy layer in the plane bonded to a circuit plate is preferably within 0.1 mm, particularly preferably within 0.05 mm. If the difference of the thickness in the aluminum alloy layer in the plane bonded to a circuit plate is larger than 0.1 mm, when machining is carried out, the bow is significantly changed at the time of subsequent annealing in some cases. Further, by heat from a device mounted, the difference in the thermal expansion between at the thickest portion and at the thinnest portion causes cracking in some cases.

The bow on the radiation plane or the plane bonded to a circuit plate is preferably imparted by machining by means of e.g. a lathe turning machine. An article to be processed is fixed to e.g. the lathe turning machine usually by screws utilizing holes or the like formed on the peripheral portion of the article to be processed. In the present invention, it is possible to obtain an ideal spherical radiation plane by machining the aluminum alloy layer on the surface of the aluminum/silicon carbide composite, and an aluminum/silicon carbide composite having favorable heat dissipation properties and stress relaxation properties can be obtained.

In a case where the thicknesses of the aluminum alloy layers of the aluminum/silicon carbide composite before machining are substantially the same, it is required to machine both principal planes to make the difference in the average thickness between the aluminum alloy layers on both principal planes be within 40% of the average thickness of the thicker aluminum alloy layer in some cases. To machine the plane bonded to a circuit plate, application of bow as in the radiation plane is not required but only surface grinding is sufficient, but the production cost will increase as compared with the case of processing only on the radiation plane. In a case where the aluminum alloy layer on the heat dissipation side is preliminarily made thick, it is suitable to machine only the radiation plane to adjust the difference in the average thickness between the aluminum alloy layers on both principal planes to be preferably within 40%, particularly preferably within 30% of the average thickness of the aluminum alloy layer on the radiation plane.

Further, the total of the average thicknesses of the aluminum alloy layers on both principal planes after machining is preferably at most 1.0 mm, particularly preferably at most 0.6 mm. If the total of the average thicknesses of the aluminum alloy layers on both principal planes exceeds 1.0 mm, the coefficient of thermal expansion of the entire aluminum/silicon carbide composite tends to be high, and accordingly, such a problem may arise that when a thermal load is applied after semiconductor components are mounted, cracking resulting from the difference in the coefficient of thermal expansion between the aluminum/silicon carbide composite and the ceramic circuit plate occurs in the solder layer, and the resulting insufficient heat dissipation may cause malfunction or fracture of the semiconductor.

The amount of bow on the radiation plane of the aluminum/silicon carbide composite after machining is preferably from 10 to 400 µm, particularly preferably from 100 to 300 µm per 200 mm on the major axis. If the amount of bow on the radiation plane is less than 100 µm, in the subsequent module assembling step, a gap will form between the radiation plane and the heat dissipation fin, and thermal conductivity decreases even if a highly thermal conductive heat dissipating grease is applied, and as a result, the heat dissipation properties of a module comprising the ceramic circuit plate, the base plate, the heat dissipation fin, and the like decrease in some cases. On the other hand, if the amount of bow exceeds 400 µm, cracking result in the aluminum/silicon carbide composite or the ceramic circuit plate at the time of bonding to the heat dissipation fin with screws in some cases. The amount of bow on the major axis of the circuit plate plane is preferably from −200 to 200 µm, particularly preferably from −100 to 100 µm per 200 mm. If the amount of bow on the major axis on the circuit plate plane is out of the above range, the solder thickness will not be constant at the time of bonding to a circuit plate, or voids are likely to form at the time of soldering, and accordingly, heat dissipation properties of a module comprising a ceramic circuit plate, the aluminum/silicon carbide composite, a heat dissipation fin, and the like decrease in some cases.

The annealing to remove distortion by processing is carried out preferably at a temperature of from 400° C. to 550° C. for at least 10 minutes. If the annealing temperature is less than 400° C., or if the annealing time is less than 10 minutes even when the annealing temperature is from 400° C. to 550° C., the distortion in the interior of the composite is not sufficiently released, and the bow is significantly changed e.g. in the subsequent step of soldering a circuit plate in some cases. Further, if the annealing temperature exceeds 550° C., the aluminum alloy after infiltration is melted in some cases.

The difference of the amount of bow on the major axis of the radiation plane between before and after the annealing is preferably at most 30 µm, particularly preferably at most 20 µm per 200 mm. If the difference of the amount of bow exceeds 30 µm, a gap is formed between the aluminum/silicon carbide composite and the heat dissipation fin in a module assembling step, and accordingly thermal conductivity decreases even if a high thermal conductive heat dissipating grease is applied in some cases.

The aluminum/silicon carbide composite of the present invention has favorable head dissipation properties and stress relaxation properties, and is suitable, for example, as a base plate to be disposed between a ceramic circuit plate and a heat dissipation component such as a heat dissipation fin.

The aluminum/silicon carbide composite of the present invention has an aluminum alloy layer on both principal planes, and it is possible to process its radiation plane into an ideal spherical shape. Thus, when the aluminum/silicon carbide composite of the present invention is used as a base plate, such effects can be obtained that the contact between the base plate and the heat dissipation component such as a heat dissipation fin will be favorable, whereby heat dissipation properties of a module comprising a ceramic circuit plate, the base plate and the heat dissipation fin and the like will be excellent.

The aluminum/silicon carbide composite of the present invention has a coefficient of thermal conductivity of at least 180 W/mK, particularly at least 200 W/m, and a coefficient of thermal expansion of at most $10 \times 10^{-6}$/K, particularly at most $8.5 \times 10^{-6}$/K. It has a high coefficient of thermal conductivity and has a low coefficient of expansion at the same level as a semiconductor component and a ceramic circuit plate, in addition to the above effects. Thus, a heat dissipation component using it, and a module using it are characterized in that they are excellent in heat dissipation properties, they are hardly deformed even when subjected to the temperature change and as a result, high reliability can be obtained.

Example 1

700 g of SiC powder A (manufactured by Pacific Rundum Co., Ltd., NG-220, average particle size: 60 µm), 300 g of SiC powder B (manufacture by YAKUSHIMA DENKO CO., LTD., GC-1000F, average particle size: 10 µm) and 100 g of a silica sol (manufactured by Nissan Chemical Industries, Ltd., SNOWTEX) were weighed, and they were mixed by a stirring mixer for 30 minutes and press molded under a pressure of 10 MPa into a flat plate having dimensions of 185 mm in length×135 mm in width×5.0 mm in thickness.

The obtained molded product was fired in atmospheric air at 900° C. for 2 hours to obtain a SiC preform having a relative density of 65 vol %, and one principal plane of the SiC preform was processed by a lathe turning machine to a convex spherical shape with a bow of 200 µm per 200 mm, and the thickness at the center portion was adjusted to 4.6 mm.

The obtained SiC preform was put in an iron frame of 185 mm in length×135 mm in width×5.2 mm in height, provided with a gate through which a molten metal enters. Alumina fibers (manufactured by Tanaka Seishi Kogyo K.K., purity 97%, sheet shape) of 185 mm in length×135 mm in width×0.4 mm in thickness were disposed on the spherical plane (radiation plane) and alumina fibers (manufactured by Tanaka Seishi Kogyo K.K., purity 97%, sheet shape) of 185 mm in length×135 mm in width×0.2 mm in thickness were disposed on the flat plane (plane to be bonded to a circuit plate), each at a content of 35 mass % based on the aluminum alloy layer to be formed.

The preform was sandwiched between carbon-coated SUS plates, and the resulting assembly was preheated in an electronic furnace at 600° C. Then, it was accommodated in a preliminarily heated press mold having an inner diameter of 300 mm, a molten metal of an aluminum alloy containing 12 mass % of silicon and 0.5 mass % of magnesium was poured and pressurized under a pressure of 100 MPa for 20 minutes so that the SiC preform was infiltrated with the aluminum alloy. After cooling to room temperature, the iron frame and the like were cut by a wet band saw, and the SUS plates were removed, and then annealing was carried out at a temperature of 530° C. for 3 hours for removal of distortion at the time of infiltration, to obtain an aluminum/silicon carbide composite.

Then, tapped holes for processing having a diameter of 8 mm were formed on four corners at the peripheral portion of the aluminum/silicon carbide composite, and the composite was fixed to a lathe turning machine jig by screws utilizing the tapped holes for processing, and the composite was processed to have a spherical shape by imparting a bow of 200 µm per 200 mm on the plane on which the thickness of the aluminum alloy layer was 0.4 mm. Further, with respect to the amount of machining, machining of 200 µm on the average was carried out so that the average thicknesses of the aluminum alloy layers on both principal planes after processing were the same, and the average thickness was adjusted to 5.0 mm. After machining, annealing was carried out at a temperature of 530° C. for 3 hours by using an electronic furnace to remove distortion by processing.

Comparative Example 1

Example Wherein Bow was Imparted by Applying Pressure with Heating

An aluminum/silicon carbide composite was prepared in the same manner as in Example 1 except that an iron frame of 185 mm in length×135 mm in width×5.0 mm in height was used, that the shape of the SiC preform was a flat plate of 185 mm in length×135 mm in width×5.0 mm in thickness, that no alumina fibers were disposed on both planes of the SiC preform, and that no machining was carried out on the preform and the aluminum/silicon carbide composite.

Then, a spherical concavo-convex carbon mold with a height of 250 µm per 250 mm was disposed on and below the obtained aluminum/silicon carbide composite, heated in atmospheric air at a temperature of 530° C. for 10 minutes and further pressurized under a pressure of 5 MPa for 10 minutes to impart bow of 200 µm per 200 mm. After bow was imparted, annealing was carried out at a temperature of 530° C. for 3 hours.

(Measurement of Physical Properties)

The aluminum/silicon carbide composite obtained in each of Example 1 and Comparative Example 1 was cut along the diagonal, and the thicknesses of the aluminum alloy layers (Al layers) on both principal planes (hereinafter referred to as principal planes 1 and 2) were measured along the diagonal with respect to 20 points at regular intervals, and the average values were calculated.

Then, the value {(the absolute value of the difference in the average thickness between the aluminum alloy layers on the principal planes 1 and 2)/(the average thickness of the thicker aluminum alloy layer)×100} was calculated. Further, a test specimen (diameter 3 mm, length 10 mm) for measuring the coefficient of thermal expansion, a test specimen (diameter 11 mm, thickness 3 mm) for measuring the coefficient of thermal conductivity and a test specimen (100 mm×50 mm×3 mm) for measuring the shape of the bow were prepared by grinding. Using the respective test specimens, the coefficient of thermal expansion from 25 to 250° C. was measured by a thermal expansion meter (manufacture by Seiko Instruments & Electronics Ltd., TMA300), and the coefficient of thermal conductivity at 25° C. was measured by a laser flash method (LF/TCM-8510B, manufactured by Rigaku Corporation). With respect to the shape of bow, using a contour measuring instrument (manufactured by TOKYO SEIMITSU CO., LTD., CONTOURECORD 1600D-22), with respect to 20 points on each test specimen, the amounts of bow per 200 mm on the diagonal on the radiation plane after machining and after annealing were measured in Example 1, and the amounts of bow per 200 mm on the diagonal on the radiation plane after bow was imparted and after annealing were measured in Comparative Example 1. Further, to examine the degree of dispersion, the average and standard deviation of the difference between the values of bow on two diagonals were calculated. The results are shown in Tables 1 and 2.

Examples 2 to 9

An aluminum/silicon carbide composite was prepared, processed and evaluated in the same manner as in Example 1 except that the thickness of the alumina fibers on the flat plane was changed to 0.1 mm so that the average thickness of the aluminum alloy layer would be 100 µm and that the spherical plane was ground by 300 µm after infiltration with the aluminum alloy (Example 2), that the thickness of the aluminum fibers on the flat plane was changed to 0.3 µm so that the average thickness of the aluminum alloy layer would be 300 µm and that the spherical plane was ground by 100 µm after infiltration with the aluminum alloy (Example 3), that the thickness of the aluminum fibers on the flat plane was changed to 0.05 mm so that the average thickness of the aluminum alloy layer would be 50 µm and that the spherical plane was ground by 350 µm after infiltration with the aluminum alloy (Example 4), that the thickness of the alumina fibers on the flat plane was changed to 0.35 mm so that the average thickness of the aluminum alloy layer would be 350 µm and that the spherical plane was ground by 50 µm (Example 5), that the thickness of the alumina fibers on the flat plane was changed stepwise with a thickness of 0.15 mm on one end and a thickness of 0.25 mm on the other end, so that the difference of the thickness in the aluminum alloy layer on the flat plane would be 100 µm (Example 6), that the thickness of the alumina fibers on the flat plane was changed to 0.12 mm (Example 7), the thickness of the alumina fibers on the flat plane was changed to 0.11 mm (Example 8), and that the thickness of the alumina fibers on the flat plane was changed to 0.1 mm. The results are shown in Tables 1 and 2.

Examples 10 to 16

An aluminum/silicon carbide composite was prepared and evaluated in the same manner as in Example 1 except that the content of the alumina fibers was 3 mass % (Example 10), that the content of the alumina fibers was 45 mass % (Example 11), that the content of the alumina fibers was 5 mass % (Example 12), the content of the alumina fibers 40 mass % (Example 13), that no alumina fibers were disposed on both planes of the SiC preform (Example 14), that spherical alumina particles (manufactured by Sumitomo Chemicals Co., Ltd., alumina CB-10 grade, purity 99.9%) were used in a content of 35 mass % instead of the alumina fibers (Example 15), and that crushed alumina particles (manufactured by SHOWA DENKO K.K., alumina AL-15-H grade, purity 99.9%) were used in a content of 35 mass % instead of the alumina fibers. The results are shown in Tables 1 and 2.

TABLE 1

| | Average thickness of Al layer (μm)*1 | | Difference in average thickness between Al layers (μm) | Dispersion of Al layer thickness (μm) (Maximum thickness) − minimum thickness) | | {(Difference in average thickness between Al layers)/ principal plane 1} × 100 (%) | Co-efficient of thermal conductivity (W/mK) | Co-efficient of thermal expansion ($10^{-6}$/K) |
|---|---|---|---|---|---|---|---|---|
| | Principal plane 1 | Principal plane 2 | | Principal plane 1 | Principal plane 2 | | | |
| Ex. 1 | 208 | 191 | 17 | 18 | 15 | 8.1 | 195 | 7.5 |
| Ex. 2 | 105 | 101 | 4 | 16 | 11 | 3.8 | 187 | 4.2 |
| Ex. 3 | 295 | 283 | 12 | 22 | 26 | 4.1 | 201 | 9.5 |
| Ex. 4 | 62 | 55 | 7 | 7 | 7 | 11.2 | 188 | 3.8 |
| Ex. 5 | 353 | 331 | 22 | 24 | 20 | 6.2 | 203 | 9.2 |
| Ex. 6 | 210 | 194 | 16 | 112 | 14 | 7.6 | 195 | 10.6 |
| Ex. 7 | 207 | 127 | 80 | 13 | 11 | 38.6 | 200 | 5.5 |
| Ex. 8 | 208 | 117 | 91 | 14 | 10 | 43.8 | 192 | 5.7 |
| Ex. 9 | 207 | 102 | 105 | 13 | 11 | 50.7 | 195 | 5.6 |
| Ex. 10 | 212 | 189 | 23 | 16 | 12 | 10.9 | 198 | 9.6 |
| Ex. 11 | 206 | 187 | 19 | 13 | 7 | 9.2 | 176 | 8.7 |
| Ex. 12 | 210 | 189 | 21 | 21 | 23 | 10 | 196 | 9.4 |
| Ex. 13 | 211 | 190 | 21 | 25 | 19 | 10 | 184 | 8.1 |
| Ex. 14 | 210 | 185 | 25 | 33 | 36 | 11.9 | 198 | 9.1 |
| Ex. 15 | 206 | 189 | 17 | 15 | 15 | 8.3 | 195 | 7.3 |
| Ex. 16 | 209 | 190 | 19 | 18 | 14 | 9.1 | 195 | 7.7 |
| Comp. Ex. 1 | 63 | 51 | 12 | 5 | 7 | 19.0 | 194 | 7.5 |

*1: The thicker one of the Al layers is taken as principal plane 1 for calculation.

TABLE 2

| | After machining or after bow was imparted *3 | | After annealing | | Difference in amount of bow between before and after annealing (μm/200 mm span) |
|---|---|---|---|---|---|
| | Average bow *2 | Standard deviation of difference in bow between two diagonals (μm/200 mm span) | Average bow *2 | Standard deviation of difference in bow between two diagonals (μm/200 mm span) | |
| Ex. 1 | 204 | 3.3 | 206 | 5.3 | 2 |
| Ex. 2 | 205 | 2.1 | 206 | 4.3 | 1 |
| Ex. 3 | 200 | 3.5 | 207 | 10.2 | 7 |
| Ex. 4 | 203 | 2.5 | 204 | 3.8 | 1 |
| Ex. 5 | 203 | 4.8 | 208 | 13.1 | 5 |
| Ex. 6 | 201 | 4.6 | 239 | 41.2 | 38 |
| Ex. 7 | 201 | 3.8 | 181 | 17.1 | 20 |
| Ex. 8 | 199 | 3.9 | 172 | 25.5 | 27 |
| Ex. 9 | 202 | 3.9 | 156 | 22.1 | 46 |
| Ex. 10 | 205 | 3.5 | 183 | 27.6 | 22 |
| Ex. 11 | 203 | 3.4 | 205 | 6.8 | 2 |
| Ex. 12 | 204 | 3.1 | 206 | 10.3 | 2 |
| Ex. 13 | 202 | 3.3 | 188 | 7.2 | 4 |
| Ex. 14 | 206 | 5.6 | 188 | 11.8 | 18 |
| Ex. 15 | 201 | 3.3 | 198 | 18.7 | 3 |
| Ex. 16 | 204 | 3.3 | 214 | 13.6 | 10 |
| Comp. Ex. 1 | 201 | 66.2 | 185 | 79.8 | 16 |

*2: Average amount of bow on major axis on radiation plane. Regarding the bow, the convex shape: +
*3: In Comparative Example 1, after bow was imparted.

INDUSTRIAL APPLICABILITY

The aluminum/silicon carbide composite of the present invention can readily be processed into a predetermined shape, its radiation plane is less likely to be distorted, and local irregular color on the outer appearance can be prevented. Thus, it is suitably used widely as e.g. a base plate for a ceramic circuit plate on which semiconductor components are mounted, for which particularly high reliability is required.

The entire disclosure of Japanese Patent Application No. 2004-266144 filed on Sep. 19, 2004 including specification, claims, drawings and summary is incorporated herein by reference in its entirety.

The invention claimed is:

1. An aluminum/silicon carbide composite, which is prepared by infiltrating a substantially flat silicon carbide porous body with a metal containing aluminum as a main component, comprising:

an aluminum alloy layer, which includes the metal containing aluminum as a main component, disposed on first and second principal surfaces of said silicon carbide porous body, wherein said first principal surface is bonded to a circuit plate and said second principal surface is a radiation surface, wherein the radiation surface of the silicon carbide porous body is formed into a convexly bowed shape, and the aluminum alloy layer on the radiation surface is machined to form a bow shape, which corresponds to the convex bow shape of the radiation surface of the silicon carbide porous body, after infiltration, wherein a change in the amount of bow is at most 30 µm per 200 mm in a major axis direction on the radiation surface, as between before and after heat treatment to remove distortion by processing, wherein an average thickness of the aluminum alloy layer on the first principal surface is x, and an average thickness of the aluminum alloy layer on the second principal surface is between x and (x-0.4x), wherein the average thickness of the aluminum alloy layer on the principal surface bonded to a circuit plate is from 0.1 to 0.3 mm, and wherein the difference of the thickness of the aluminum alloy layer in the principal surface bonded to a circuit plate is less than 0.1 mm.

2. The aluminum/silicon carbide composite according to claim 1, wherein the aluminum alloy layer made of a metal containing aluminum as the main component contains from 5 to 40 mass % of at least one member among fibers, spherical particles and crushed particles, containing alumina or silica as the main component.

3. The aluminum/silicon carbide composite according to claim 1, having a coefficient of thermal conductivity of at least 180 W/mK and a coefficient of thermal expansion of at most $10 \times 10^{-6}$/K.

4. The aluminum/silicon carbide composite according to claim 1, being produced by high pressure casting.

5. The aluminum/silicon carbide composite according to claim 1, wherein the first principal surface of the silicon carbide porous body is an entirely continuous planar surface.

6. The aluminum/silicon carbide composite according to claim 1, wherein the second principal surface of the silicon carbide porous body is continuously convex from a first edge to a second opposite edge.

7. The aluminum/silicon carbide composite according to claim 1, wherein a first portion of the aluminum alloy layer at a middle section of the second principal surface where the silicon carbide porous body is thickest is substantially the same thickness as a portion of the aluminum alloy layer at an edge section of the second principal surface where the silicon carbide porous body is thinnest, such that a thickness of the aluminum alloy layer across the entire convex shape of the second principal surface of the silicon carbide porous body is substantially the same thickness.

8. An aluminum/silicon carbide composite, which is prepared by infiltrating a substantially flat silicon carbide porous body with a metal containing aluminum as a main component, comprising:

an aluminum alloy layer, which includes the metal containing aluminum as a main component, disposed on first and second principal surfaces of said silicon carbide porous body, wherein said first principal surface is bonded to a circuit plate and said second principal surface is a radiation surface, wherein the radiation surface of the silicon carbide porous body is formed into a convexly bowed shape, and the aluminum alloy layer on the radiation surface is machined to form a bow shape, which corresponds to the convex bow shape of the radiation surface of the silicon carbide porous body, after infiltration, wherein an average thickness of the aluminum alloy layer on the first principal surface is x, and an average thickness of the aluminum alloy layer on the second principal surface is between x and (x-0.4x), wherein the average thickness of the aluminum alloy layer on the principal surface bonded to a circuit plate is from 0.1 to 0.3 mm, and wherein the difference of the thickness of the aluminum alloy layer in the principal surface bonded to a circuit plate is less than 0.1 mm.

9. The aluminum/silicon carbide composite according to claim 8, wherein the aluminum alloy layer made of a metal containing aluminum as the main component contains from 5 to 40 mass % of at least one member among fibers, spherical particles and crushed particles, containing alumina or silica as the main component.

10. The aluminum/silicon carbide composite according to claim 8, having a coefficient of thermal conductivity of at least 180 W/mK and a coefficient of thermal expansion of at most $10 \times 10^{-6}$/K.

11. The aluminum/silicon carbide composite according to claim 8, being produced by high pressure casting.

* * * * *